(12) United States Patent
Karp

(10) Patent No.: US 9,548,738 B2
(45) Date of Patent: *Jan. 17, 2017

(54) HIGH VOLTAGE RC-CLAMP FOR ELECTROSTATIC DISCHARGE (ESD) PROTECTION

(75) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 689 days.

This patent is subject to a terminal disclaimer.

(21) Appl. No.: 13/401,439

(22) Filed: Feb. 21, 2012

(65) Prior Publication Data

US 2013/0215541 A1 Aug. 22, 2013

(51) Int. Cl.
*H03K 19/003* (2006.01)
*H01L 27/02* (2006.01)

(52) U.S. Cl.
CPC ..... *H03K 19/00346* (2013.01); *H01L 27/0285* (2013.01)

(58) Field of Classification Search
USPC .......................................................... 361/56
See application file for complete search history.

(56) References Cited

U.S. PATENT DOCUMENTS

| 5,159,518 | A | * | 10/1992 | Roy ................................. 361/56 |
| 5,530,612 | A | | 6/1996 | Maloney |
| 6,262,873 | B1 | * | 7/2001 | Pequignot et al. ........... 361/111 |
| 6,801,416 | B2 | | 10/2004 | Hatzilambrou et al. |
| 7,511,550 | B2 | | 3/2009 | Bhattacharya et al. |
| 7,525,779 | B2 | | 4/2009 | Chen et al. |
| 7,839,612 | B1 | | 11/2010 | Chan |
| 8,390,360 | B2 | | 3/2013 | Gist et al. |
| 2004/0125521 | A1 | * | 7/2004 | Salling et al. ................. 361/56 |
| 2005/0045909 | A1 | | 3/2005 | Zhang |
| 2005/0151200 | A1 | | 7/2005 | Chen |
| 2010/0214706 | A1 | | 8/2010 | Crespo et al. |
| 2010/0328826 | A1 | * | 12/2010 | Salman et al. ................. 361/56 |
| 2011/0317316 | A1 | | 12/2011 | Mozak et al. |
| 2013/0162331 | A1 | | 6/2013 | Hsieh et al. |

FOREIGN PATENT DOCUMENTS

WO WO 2009/050641 A2 4/2009

OTHER PUBLICATIONS

U.S. Appl. No. 13/784,161, filed Mar. 4, 2013, Karp.

* cited by examiner

*Primary Examiner* — Ann Hoang
(74) *Attorney, Agent, or Firm* — Gerald Chan

(57) ABSTRACT

In accordance with some embodiments, an electrostatic discharge (ESD) protection circuit for high-voltage power rails includes an RC-triggered clamp having an RC-circuit having a resistor coupled between a first node and a second node, and a capacitor coupled between the second node and a third node. The RC-triggered clamp also has a transistor with a first source/drain, a gate, and a second source/drain, wherein the first source/drain is coupled to the first node, and the second source/drain is coupled to the third node. The RC-triggered clamp also has an inverter, wherein an input of the inverter is coupled to the second node, and an output of the inverter is coupled to the gate of the transistor. The ESD protection circuit also includes one or more forward-biased diodes coupled in series between a supply node and the first node.

17 Claims, 3 Drawing Sheets

HIGH VOLTAGE RC-CLAMP FOR ELECTROSTATIC DISCHARGE (ESD) PROTECTION

FIELD OF THE INVENTION

An embodiment relates generally to electrostatic discharge (ESD) protection, and in particular to a high voltage RC-clamp for ESD protection.

BACKGROUND

Electrostatic discharge (ESD) is a momentary and sudden electric current that flows when an excess of electric charge, stored on an electrically insulated structure, finds a path to a structure at a different electrical potential, such as ground. ESD is particularly a serious concern with micro-electronic devices. The integrated circuits (IC) in these devices are made from semiconductor materials, such as silicon, and insulating materials, such as silicon dioxide, which can break down when exposed to high voltages.

ICs are protected against damage due to ESD by a variety of circuit techniques. However, for high voltage power rails, wherein the voltage provided by the power supply is greater than the maximum voltage supported by ESD protection components for reliable operation, current approaches for providing ESD protection are insufficient. Prior approaches suffer from latch-up (e.g., a particular type of short circuit that can occur in an improperly designed circuit), insufficient ESD protection, and size restrictions.

SUMMARY

In accordance with some embodiments, an electrostatic discharge (ESD) protection circuit for high-voltage power rails includes an RC-triggered clamp having an RC-circuit having a resistor coupled between a first node and a second node, and a capacitor coupled between the second node and a third node. The RC-triggered clamp also has a transistor with a first source/drain, a gate, and a second source/drain, wherein the first source/drain is coupled to the first node, and the second source/drain is coupled to the third node. The RC-triggered clamp also has an inverter, wherein an input of the inverter is coupled to the second node, and an output of the inverter is coupled to the gate of the transistor. The ESD protection circuit also includes one or more forward-biased diodes coupled in series between a supply node and the first node.

In one or more embodiments, the one or more forward-biased diodes coupled in series may comprise three forward-biased diodes coupled in series.

In one or more embodiments, the resistor and the capacitor may have a time constant of at least 1 μs.

In one or more embodiments, the transistor may be an nMOS transistor, the first source/drain may be a drain, and the second source/drain may be a source.

In one or more embodiments, a pair of steering diodes may be coupled to an input/output (I/O) pad to facilitate discharge of ESD present at the I/O pad, one of the pair of steering diodes coupled between the supply node and the I/O pad, and another one of the pair of steering diodes coupled between the I/O pad and the third node.

In one or more embodiments, the pair of steering diodes may be a pair of human body model (HBM) diodes, wherein one of the pair of HMB diodes may be coupled between the supply node and the I/O pad, and another one of the pair of HBM diodes may be coupled between the I/O pad and the third node.

In one or more embodiments, the pair of steering diodes may be a pair of charge device model (CDM) diodes, wherein one of the pair of CDM diodes may be coupled between the supply node and the I/O pad, and another one of the pair of CDM diodes may be coupled between the I/O pad and the third node.

In one or more embodiments, the transistor may have an on-state, and a duration of the on-state may be dependent on a time constant of the RC-circuit.

In one or more embodiments, the RC-triggered clamp may be configured to support a maximum voltage of 2V.

In one or more embodiments, the supply node may be coupled to a supply voltage of at least 3.3 V.

In accordance with other embodiments, a method for providing electrostatic discharge (ESD) protection to an integrated circuit includes passing an ESD from a supply node to a first node of an RC-triggered clamp, generating an output signal at a second node of the RC-triggered clamp in response to the ESD, receiving the output signal at an input of an inverter of the RC-triggered clamp, providing an inverted output signal at an output of the inverter in response to the received output signal received at the input of the inverter, and discharging the ESD though a transistor of the RC-triggered clamp.

In one or more embodiments, generating the output signal at the second node of the RC-triggered clamp may be performed by an RC circuit.

In one or more embodiments, the RC circuit may have a time constant of at least 1 μs.

In one or more embodiments, the output signal received at the input of the inverter may be a logic "low" signal, and the inverted output signal at the output of the inverter may be a logic "high" signal.

In one or more embodiments, a duration of time that the ESD is discharged through the transistor of the RC-triggered clamp may be determined by a time constant of an RC circuit of the RC-triggered clamp.

In one or more embodiments, the method may further include steering the ESD from an I/O pad to the supply node through a pair of human body model (HBM) diodes.

In one or more embodiments, the method may further include steering the ESD from an I/O pad to the supply node through a pair of CDM diodes.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of in scope.

DETAILED DESCRIPTION

Figure 1:
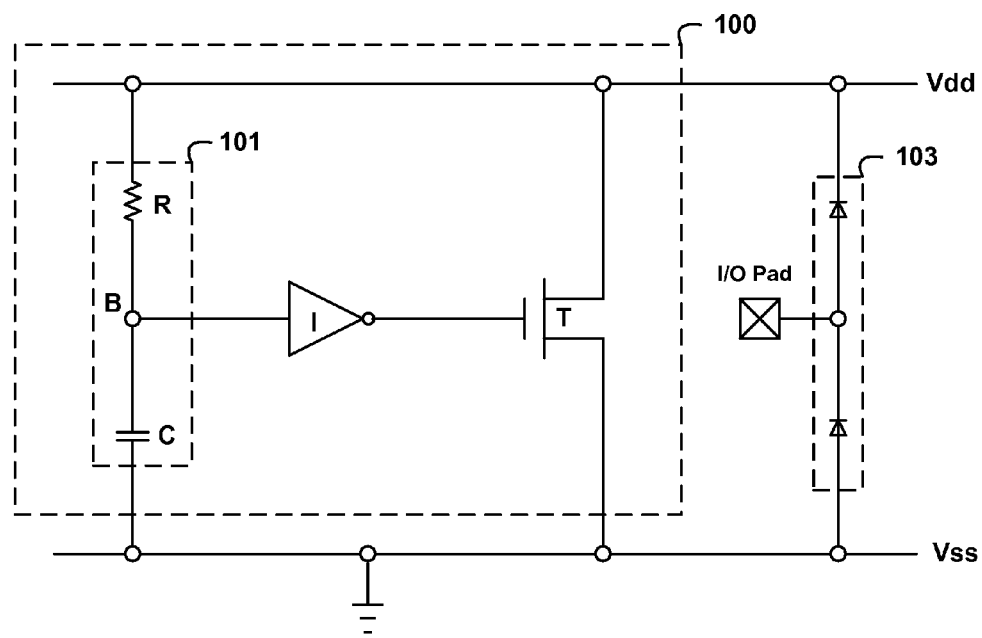
FIG. 1 illustrates a circuit diagram of an RC-triggered clamp for ESD protection.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiment" in various places throughout this specification are not necessarily referring to the same embodiment or embodiments.

During packaging and handling of integrated circuits, package pins are exposed and thus, the integrated circuit is potentially susceptible to electrostatic discharge that may damage the underlying integrated circuit such that it is unreliable or ineffective during operation. RC-triggered clamps may be used to provide electrostatic discharge (ESD) protection to such integrated circuits. RC-triggered clamps may be used for ESD protection because of their low triggering voltage (e.g., voltage at which ESD protection occurs), which allows them to protect against higher voltage ESD in comparison to other ESD protection mechanisms. An RC-triggered clamp may have a natural triggering voltage of approximately 0.5 V, whereas other ESD protection mechanisms (e.g., GGNMOS) may have a natural triggering voltage as high as 8 V.

FIG. 1 illustrates a circuit diagram of an RC-triggered clamp 100 for protecting an integrated circuit. The RC-triggered clamp 100 includes an RC circuit 101, an inverter I, and a transistor T. The RC circuit 101 includes a resistor R coupled between a supply node Vdd and a node B in series with a capacitor C coupled between the node B and a node Vss. The transistor T, which includes a first source/drain, a gate, and a second source/drain, is configured such that the first source/drain is coupled to the supply node Vdd, and the second source/drain is coupled to the node Vss. An input of the inverter I is coupled to node B and an output of the inverter I is coupled to the gate of the transistor T.

The supply node Vdd may be coupled to a supply voltage and the node Vss may be coupled to the ground. For purposes of illustration, the transistor T in FIG. 1 is an NMOS transistor, with its first source/drain being a drain and its second source/drain being a source. The transistor T turns on and conducts current when the drain and gate of the transistor T is at a higher potential than the source of the transistor T. However, when the gate of the transistor is at the same potential as the source of the transistor, the transistor is switched to and remains in an off-state.

The RC-triggered clamp 100 is configured to provide ESD protection to an integrated circuit (not shown). The RC-triggered clamp 100 provides a discharge mechanism for discharging ESD that becomes present at an I/O pad located between the supply node Vdd and third node Vss. A pair of steering diodes 103 may be coupled to the I/O pad to facilitate discharge of ESD present at the I/O pad. One of the pair of steering diodes 103 may be coupled between the supply node Vdd and the I/O pad, and another one of the pair of steering diodes 103 may be coupled between the I/O pad and the node Vss.

During normal operation of the integrated circuit being protected by the RC-triggered clamp, the potential at the gate of the transistor T is lower than or equal to the potential of the source of the transistor T, and as such the transistor remains in an off-state such that it does not redirect current that should be flowing through the integrated circuit.

However, when an ESD is present at the I/O pad, and thus present at the supply node Vdd, the RC circuit 101 and inverter I operate to turn on the transistor T in order to provide a path between the supply node Vdd and the node Vss for discharging the ESD. In response to the ESD at the supply node Vdd, the RC circuit 101 generates an output signal at node B. This output signal is received by the input of the inverter I and an inverted output signal is generated at the output of the inverter. This inverted output signal is coupled to the gate of the transistor T. Because the inverted output signal at the gate of the transistor T is at a higher potential than the potential of the source of the transistor T, the transistor T turns-on, providing a discharge path between the supply node Vdd and the node Vss for discharging the ESD.

The duration of the on-state of the transistor T is determined by the time constant of the RC circuit 101. The time constant of the RC circuit 100 is characterized as the product of the resistance of the resistor R and the capacitance of the capacitor C. For the duration of the time constant of the RC circuit 101, the transistor T remains in an on-state and provides a discharge path for ESD present at the I/O pad. After the duration of the time constant of the RC circuit 101, the transistor 101 switches back to an off-state and no longer provides a discharge path to ESD present at the I/O pad.

While the RC-triggered clamp 100 may provide some ESD protection for many integrated circuits, they may be unable to maintain reliable operation for high-voltage power rails. High-voltage power rails are characterized by supply voltages (Vdd) that are substantially greater than the maximum voltage supported by components of the RC-triggered clamp for reliable operation. In some embodiments, for an RC-triggered clamp, the maximum voltage supported for reliable operation is approximately 2V. In other embodiments, for other I/O interfaces, supply voltages (Vdd) of 3.3V or greater may be used for operation. Because the supply voltage may exceed the maximum voltage supported by the RC-triggered clamp for reliable operation, in some cases, the RC-clamps cannot be used by themselves for providing ESD protection to integrated circuits associated with high-voltage power rails.

Several approaches may be used for providing ESD protection for high-voltage power rails involve using silicon-controlled rectifiers (SCR) or cascoded ground gate n-type metal-oxide semiconductor transistors (GGNMOS).

SCR is a four-layer solid state device that controls current. However, ESD protection approaches that employ SCR may suffer from latch-up during IC operation as well as during exposure to ESD (e.g., single event upset (SEU)). Latch-up refers to the inadvertent creation of a low-impedance path between power supply rails that trigger a parasitic structure which disrupts proper functioning of the SCR, possibly even leading to the destruction of the SCR due to overcurrent. Because SCR protection schemes may be highly susceptible to latch-up, they may fail to provide optimal ESD protection for integrated circuits associated with high-voltage power rails.

Figure 2:
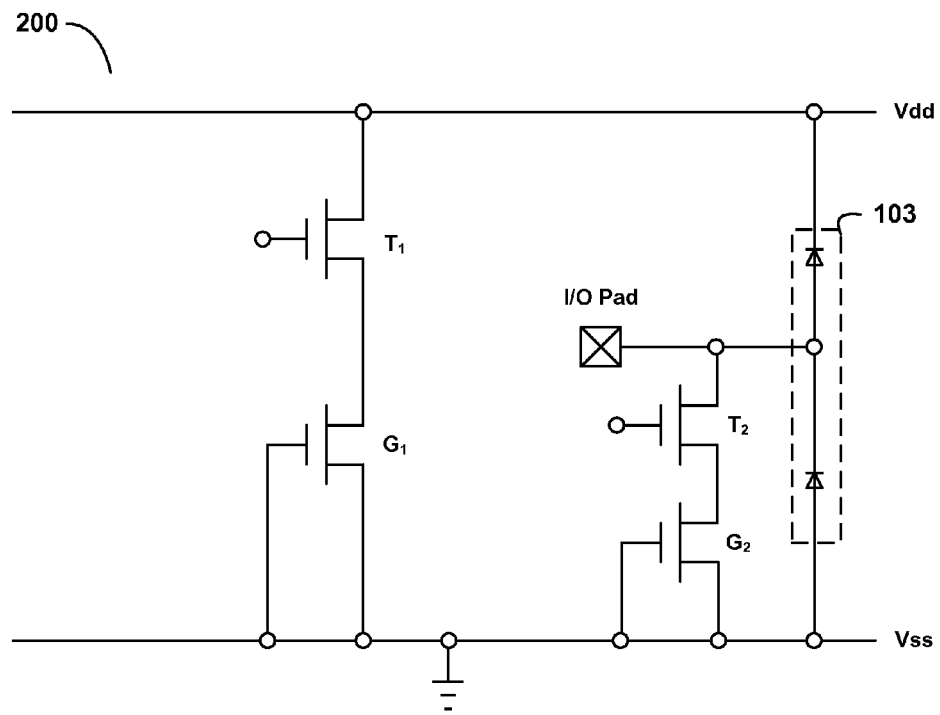
FIG. 2 illustrates a circuit diagram of a (grounded-gate NMOS) GGNMOS clamp for ESD protection of integrated circuits associated with high-voltage power rails.

ESD protection that utilizes GGNMOS may provide another approach for protecting integrated circuits associated with high-voltage power rails. FIG. 2 illustrates an ESD protection scheme 200 that utilizes GGNMOS protection. A first transistor $T_1$ in series with a GGNMOS power clamp $G_1$ is coupled between a supply node Vdd and a node Vss (which may be ground). A second transistor $T_2$ in series with a GGNMOS pad clamp $G_2$ is coupled between the I/O pad and the node Vss. A pair of steering diodes 103 may be coupled to the I/O pad to facilitate discharge of ESD present at the I/O pad. One of the pair of steering diodes 103 may be coupled between the supply node Vdd and the I/O pad, and another one of the pair of steering diodes 103 may be coupled between the I/O pad and the node Vss.

When ESD is present at the I/O pad, a discharge path is created between the supply node Vdd and ground Vss through the first transistor $T_1$ and the GGNMOS power clamp $G_1$ to discharge ESD. Excess ESD may be discharged through the second transistor $T_2$ and the GGNMOS pad clamp $G_2$. The second transistor $T_2$ and GGNMOS pad clamp $G_2$ are required to provide ESD protection in situations where the ESD exceeds the first transistor $T_1$ and GGNMOS power clamp's $G_1$ capacity to discharge.

While ESD protection may utilize GGNMOS, which may provide some ESD protection for integrated circuits associated with high-voltage power rails, it may suffer from several disadvantages. The requirement of a GGNMOS pad clamp $G_2$ in addition to the GGNMOS power clamp $G_1$ may increase the total chip area required for providing ESD protection. Because of size limitations imposed for manufacturing, the addition of an adequate GGNMOS pad clamp $G_2$ may exceed size requirements or limit the ability to add additional circuit components to the integrated circuit. Likewise, the addition of a GGNMOS pad clamp $G_2$ may create a load capacitance that diminishes the effectiveness of the integrated circuit during operation.

Furthermore, GGNMOS power clamp may suffer from having a high triggering voltage. For example, in some cases, an RC-triggered clamp (such as that described with reference to FIG. 1) may have a triggering voltage of roughly 0.5 V, while a GGNMOS power clamp may have a natural triggering voltage of 8V. In order to reduce the natural triggering voltage, an additional mask/process step may be introduced during production of the GGNMOS power clamp. The high triggering voltage may result in the GGNMOS power clamp providing ESD protection that is reduced by a factor of 2 when compared to the RC-triggered clamp. For example, for similar ESD protection circuits, one that implements an RC-triggered clamp may be able to support a 600 V charge-device model (CDM) ESD, whereas one that implements GGNMOS may only support a 300 V CDM ESD.

Thus, ESD protection that utilizes GGNMOS may fail to provide optimal ESD protection to integrated circuits associated with high-voltage power rails.

Figure 3:
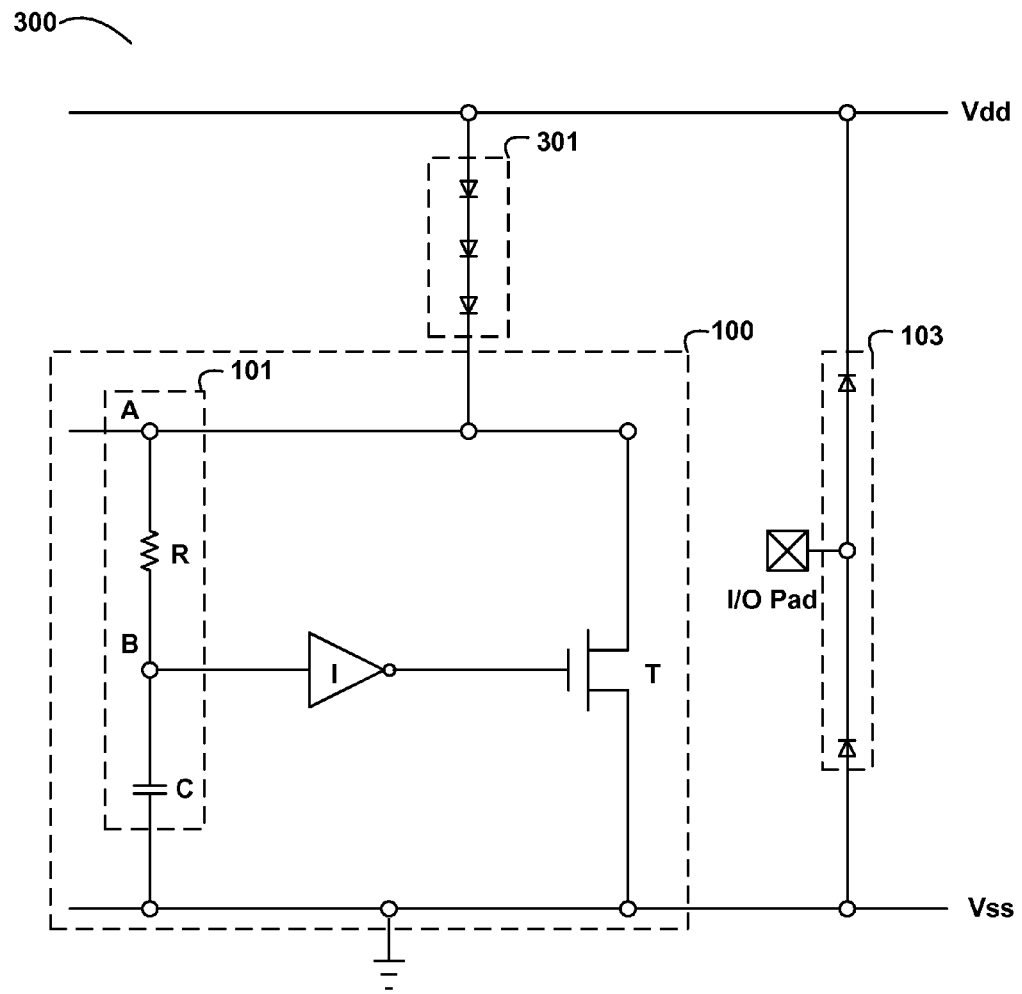
FIG. 3 illustrates a circuit diagram of an RC-triggered clamp for ESD protection of integrated circuits associated with high-voltage power rails.

FIG. 3 illustrates a circuit diagram of an ESD protection circuit 300 that implements an RC-triggered clamp for supporting high-voltage power rails. The ESD protection circuit in FIG. 3 includes an RC-triggered clamp 100 and one or more forward-biased diodes 301.

The RC-triggered clamp 100 includes an RC circuit 101, an inverter I, and a transistor T, and is substantially the same as the RC-triggered clamp 100 described above in FIG. 1. The RC circuit 101 includes a resistor R coupled between a first node A and a second node B in series with a capacitor C coupled between the second node B and a third node Vss. The transistor T, which includes a first source/drain, a gate, and a second source/drain, is configured such that the first source/drain is coupled to the first node A, and the second source/drain is coupled to the third node Vss. An input of the inverter I is coupled to the second node B and an output of the inverter I is coupled to the gate of the transistor T.

In some embodiments, the transistor T is an NMOS transistor and the first source/drain is a drain and the second source/drain is a source. However, one ordinarily skilled in the art will recognize that other transistors may also be used in place of the NMOS transistor.

The RC-triggered clamp 100 is configured to provide ESD protection to an integrated circuit (not shown). The RC-triggered clamp 100 provides a discharge mechanism for discharging ESD that becomes present at an I/O pad located between a supply node Vdd and the third node Vss. A pair of steering diodes 103 may be coupled to the I/O pad to facilitate discharge of ESD present at the I/O pad. One of the pair of steering diodes 103 may be coupled between the supply node Vdd and the I/O pad, and another one of the pair of steering diodes 103 may be coupled between the I/O pad and the third node Vss. In some embodiments, the pair of steering diodes 103 may be a pair of human body model (HMB) diodes, wherein one of the pair of HBM diodes is coupled between the supply node Vdd and the I/O pad, and another of the pair of HBM diodes is coupled between the I/O pad and the third node Vss. In other embodiments, the pair of steering diodes 103 may be a pair of charge device model (CDM) diodes, wherein one of the pair of CDM diodes is coupled between the supply node Vdd and the I/O pad, and another of the pair of CDM diodes is coupled between the I/O pad and the third node Vss.

In order for the RC-triggered clamp 100 to support operation of a high-voltage power rail (e.g., supply voltage), the voltage level seen at the first node A should not exceed the maximum voltage supported by the RC-triggered clamp 100 for reliable operation. Thus, a series of forward-biased diodes 301 is coupled between the supply node Vdd and the first node A. Each forward-biased diode effectively reduces the voltage seen at the first node A by approximately 0.6 V (e.g., 0.6 V±0.1 V). Thus, the number of forward-biased diodes may be modified depending on the particular application. For example, where the supply voltage coupled to the supply node Vdd is 3.3 V and the RC-triggered clamp 100 is capable of supporting a maximum voltage of 1.8 V, 3 forward-biased diodes may be coupled between the supply node Vdd and the first node A to reduce the voltage seen at the first node A below 1.8 V (e.g. 3.3−0.6−0.6−0.6=1.5V). In other embodiments, each forward-biased diode may be configured to reduce the voltage seen at the first node A by an amount that is different from 0.6 V (e.g., may an amount that is higher than 0.6 V, or that is lower than 0.6 V). Also, in other embodiments, the supply voltage may be higher than 3.3 V or lower than 3.3 V. Furthermore, in other embodiments, the RC-triggered clamp 100 may be configured to support voltage having other maximum values that are different from 1.8 V (e.g., that are higher than 1.8 V or lower than 1.8 V).

As described above, the transistor T turns on and conducts current when the drain and gate of the transistor T is at a higher potential than the source of the transistor T. However, when the gate of the transistor T is at the same potential or a lower potential than the source of the transistor, the transistor T is switched to and remains in an off-state.

During normal operation of the integrated circuit (not shown) being protected by the RC-triggered clamp 100, the potential at the gate of the transistor T is lower than or equal to the potential of the source of the transistor T, and as such the transistor T remains in an off-state such that it does not redirect current that should be flowing through the integrated circuit.

However, when an ESD is present at the I/O pad, the RC circuit 101 and inverter I of the RC-triggered clamp 100 operate to turn on the transistor T in order to provide a path between the first node A and third node Vss for discharging the ESD present at the I/O pad. The ESD travels from the I/O pad, through the forward-biased diodes 301 to the first node A. In response to the ESD at the first node A, the RC circuit 101 generates an output signal at the second node B. This output signal is received by the input of the inverter I and an inverted output signal is generated at the output of the inverter I in response to the output signal received by the input of the inverter I. This inverted output signal is coupled to the gate of the transistor T. Because the inverted output signal at the gate of the transistor T is at a higher potential than the potential of the source of the transistor T, the transistor T turns-on, providing a discharge path between the first node A and the third node Vss for discharging the ESD present at the I/O pad.

Also, as discussed above, the duration of the on-state of the transistor T is determined by the time constant of the RC circuit 101. The time constant of the RC circuit 101 is characterized as the product of the resistance of the resistor R and the capacitance of the capacitor C. For the duration of the time constant of the RC circuit 101, the transistor T remains in an on-state and provides a discharge path to ESD present at the I/O pad. After the duration of the time constant of the RC circuit 101, the transistor T switches back to an off-state and no longer provides a discharge path to ESD present at the I/O pad.

In some embodiments, the RC-triggered clamp is configured such that the RC circuit 101 has a time constant of 1 μs, which allows adequate time for ESD present at the I/O pad to discharge through the transistor T. For example, the resistor R may have a resistance value of 10 kΩ and the capacitor may have a capacitance of 10 pF, the product of which is a time constant (τ=RC) of 1 μs, which allows ESD to be discharged through the transistor T for at least 1 μs. In other embodiments, the time constant may be different from 1 μs (e.g., higher than 1 μs, or lower than 1 μs). Also, in other embodiments, the resistor R may have a resistance value that is different from 10 kΩ (e.g., higher than 10 kΩ, or lower than 10 kΩ). Furthermore the capacitor may have a capacitance that is different from 10 pF (e.g., higher than 10 pF, or lower than 10 pF).

Thus, by introducing a series of forward-biased diodes 301 between the supply node Vdd and the first node A of the RC triggered clamp 100, the voltage seen by the first node A of the RC-triggered clamp 100 may be effectively reduced below the maximum voltage supported by the RC-triggered clamp 100. In this way, the RC-triggered clamp 100 may provide ESD protection to the integrated circuit without suffering from reliability issues. The ESD protection provided by the RC-triggered clamp 100 overcomes the disadvantages of other approaches in that it does not suffer from latch-up, size restrictions, or ESD protection limitations.

Figure 4:
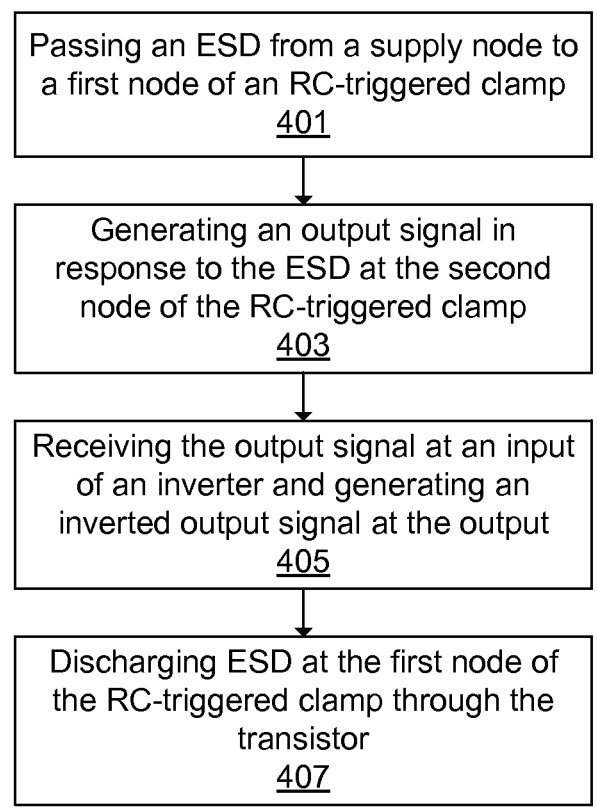
FIG. 4 illustrates a flow diagram of a method for providing ESD protection to integrated circuits associated with high-voltage power rails.

FIG. 4 illustrates a flow diagram of an approach for providing ESD protection to integrated circuits associated with high-voltage power rails.

Initially, an ESD is passed from a supply node to a first node of an RC-triggered clamp through a series of forward-biased diodes as described at 401. In some embodiments, the RC-triggered clamp may be the RC-triggered clamp 100, and the forward-biased diodes may be the forward-biased diodes 301 described with reference to the embodiments of FIG. 3. The number of forward-biased diodes may be modified according to the particular application and depending on the maximum voltage supported by the RC-triggered clamp for reliable operation. For example, where the supply node has a potential of 3.3 V and the RC-triggered clamp can only support a maximum voltage of 1.8 V for reliable operation, three forward-biased diodes may be implemented to reduce the potential seen by the RC-triggered clamp to 1.5 V, as similarly discussed with reference to FIG. 3.

The RC circuit then generates an output signal in response to the ESD at a second node of the RC-triggered clamp as described at 403. In some embodiments, the RC circuit may be the RC circuit 101 described with reference to FIG. 3. With reference to the RC-triggered clamp 100 of FIG. 3, it can be seen that the output signal generated by the RC circuit 101 is present at the second node B of the RC-triggered clamp 100.

The output signal is received at an input of an inverter and an inverted output signal is generated at the output of the inverter as described at 405. For example, a logic "high" signal may be received at the input of the inverter and a logic "low" signal may be generated at the output. A transistor turns on in response to receiving the inverted output signal at its gate. In some embodiments, the inverter may be the inverter I, and the transistor may be the transistor T, described with reference to FIG. 3.

ESD at the first node is then discharged through the transistor as described at 407. The duration that the transistor remains in an "on" state and conducts ESD is dependent on the time constant of the RC circuit. As mentioned above with reference to FIG. 3, the time constant is the product of the resistance of the resistor and the capacitance of the capacitor of the RC circuit.

In this way an RC-triggered clamp may provide ESD protection to an integrated circuit associated with a high-voltage power rail. Reliable operation of the RC-triggered clamp is maintained as the maximum voltage imposed on the RC-triggered clamp is reduced by the series of forward-biased diodes.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. An electrostatic discharge (ESD) protection circuit, comprising:
   an RC-triggered clamp comprising:
      an RC-circuit having a resistor coupled between a first node and a second node, and a capacitor coupled between the second node and a third node;
      a transistor with a first source/drain, a gate, and a second source/drain, wherein the first source/drain is coupled to the first node, and the second source/drain is coupled to the third node; and an inverter, wherein an input of the inverter is coupled to the second node, and an output of the inverter is coupled to the gate of the transistor; and one or more forward-biased diodes coupled in series between a supply node and the first node;

wherein the RC-triggered clamp is configured to support a maximum voltage;

wherein the maximum voltage supported by the RC-triggered clamp is less than a voltage provided by the supply node; and wherein the one or more forward-biased diodes are configured to reduce a voltage seen at the first node to a level that is equal to or less than the maximum voltage supported by the RC-triggered clamp.

2. The ESD protection circuit of claim 1, wherein the one or more forward-biased diodes coupled in series comprises three forward-biased diodes coupled in series.

3. The ESD protection circuit of claim 1, wherein the resistor and the capacitor have a time constant of at least 1 μs.

4. The ESD protection circuit of claim 1, wherein the transistor is an nMOS transistor, the first source/drain is a drain, and the second source/drain is a source.

5. The ESD protection circuit of claim 1, wherein:
a pair of steering diodes is coupled to an input/output (I/O) pad to facilitate discharge of ESD present at the I/O pad;
one of the pair of steering diodes is coupled between the supply node and the I/O pad; and
another one of the pair of steering diodes coupled between the I/O pad and the third node.

6. The ESD protection circuit of claim 5, wherein:
the pair of steering diodes is a pair of human body model (HBM) diodes;
one of the pair of HMB diodes is coupled between the supply node and the I/O pad; and
another one of the pair of HBM diodes is coupled between the I/O pad and the third node.

7. The ESD protection circuit of claim 5, wherein:
the pair of steering diodes is a pair of charge device model (CDM) diodes;
one of the pair of CDM diodes is coupled between the supply node and the I/O pad; and
another one of the pair of CDM diodes is coupled between the I/O pad and the third node.

8. The ESD protection circuit of claim 1, wherein:
the transistor has an on-state; and
a duration of the on-state is dependent on a time constant of the RC-circuit.

9. The ESD protection circuit of claim 1, wherein the maximum voltage supported by the RC-triggered clamp is 2V.

10. The ESD protection circuit of claim 1, wherein the supply node is coupled to a supply voltage of at least 3.3 V.

11. A method for providing electrostatic discharge (ESD) protection to an integrated circuit, comprising:
passing an ESD from a supply node to a first node of an RC-triggered clamp, wherein a maximum voltage supported by the RC-triggered clamp is less than a voltage provided by the supply node, and wherein a voltage seen at the first node is reduced by one or more forward-biased diodes to a level that is equal to or less than the maximum voltage supported by the RC-triggered clamp;
generating an output signal at a second node of the RC-triggered clamp in response to the ESD;
receiving the output signal at an input of an inverter of the RC-triggered clamp;
providing an inverted output signal at an output of the inverter in response to the received output signal received at the input of the inverter; and
discharging the ESD though a transistor of the RC-triggered clamp.

12. The method of claim 11, wherein generating the output signal at the second node of the RC-triggered clamp is performed by an RC circuit.

13. The method of claim 12, wherein the RC circuit has a time constant of at least 1 μs.

14. The method of claim 11, wherein the output signal received at the input of the inverter is a logic "low" signal, and the inverted output signal at the output of the inverter is a logic "high" signal.

15. The method of claim 11, wherein a duration of time that the ESD is discharged through the transistor of the RC-triggered clamp is determined by a time constant of an RC circuit of the RC-triggered clamp.

16. The method of claim 11, further comprising steering the ESD from an I/O pad to the supply node through a pair of human body model (HBM) diodes.

17. The method of claim 11, further comprising steering the ESD from an I/O pad to the supply node through a pair of CDM diodes.

* * * * *